United States Patent
Matte

(10) Patent No.: US 8,917,187 B2
(45) Date of Patent: Dec. 23, 2014

(54) MULTI-FUNCTION FLARE DEVICE FOR POPULATED AREAS

(71) Applicant: 425, Inc., Racine, WI (US)

(72) Inventor: Kevin D. Matte, Milwaukee, WI (US)

(73) Assignee: 425, Inc., Racine, WI (US)

( * ) Notice: Subject to any disclaimer, the term of this patent is extended or adjusted under 35 U.S.C. 154(b) by 0 days.

(21) Appl. No.: 13/676,549

(22) Filed: Nov. 14, 2012

(65) Prior Publication Data

US 2013/0069793 A1 Mar. 21, 2013

Related U.S. Application Data

(63) Continuation of application No. 12/612,632, filed on Nov. 4, 2009, now abandoned.

(60) Provisional application No. 61/113,117, filed on Nov. 10, 2008.

(51) Int. Cl.
| | |
|---|---|
| *G08B 5/00* | (2006.01) |
| *G08B 5/22* | (2006.01) |
| *H05K 13/04* | (2006.01) |
| *G01S 1/70* | (2006.01) |
| *G08B 5/36* | (2006.01) |
| *G08G 1/095* | (2006.01) |
| *G08G 1/00* | (2006.01) |
| *F21V 21/08* | (2006.01) |

(52) U.S. Cl.
CPC .. *G08B 5/36* (2013.01); *G08B 5/22* (2013.01); *H05K 13/04* (2013.01); *G01S 1/70* (2013.01)
USPC .............. 340/815.4; 340/815.74; 340/815.73; 340/908; 340/908.1; 362/103

(58) Field of Classification Search
USPC .......................................... 340/815.4, 815.74
See application file for complete search history.

(56) References Cited

U.S. PATENT DOCUMENTS

| | | | |
|---|---|---|---|
| 4,047,165 | A | 9/1977 | Andreasson et al. |
| 4,319,309 | A | 3/1982 | Benoit |
| 4,328,533 | A | 5/1982 | Paredes |
| 4,837,559 | A | 6/1989 | Green, Sr. |
| 4,999,753 | A | 3/1991 | MacKenzie |
| D340,777 | S | 10/1993 | Choi et al. |
| 5,434,759 | A | 7/1995 | Endo et al. |
| 5,627,513 | A | 5/1997 | Weed et al. |
| 5,652,570 | A | 7/1997 | Lepkofker |
| 5,806,965 | A | 9/1998 | Deese |
| 5,905,441 | A | 5/1999 | Klee et al. |
| 5,963,126 | A | 10/1999 | Karlin et al. |
| 6,137,396 | A | 10/2000 | Puppo |
| 6,461,015 | B1 | 10/2002 | Welch |
| 6,486,797 | B1 | 11/2002 | Laidman |
| D486,932 | S | 2/2004 | Dario et al. |

(Continued)

*Primary Examiner* — Jack K Wang
(74) *Attorney, Agent, or Firm* — Ziolkowski Patent Solutions Group, SC

(57) ABSTRACT

The invention disclosed herein is a securely attached portable, wearable device to enhance safety, visibility and communication capability of safety personnel when such personal leave their vehicles. The device provided is configured to be securely attached to the wearer, and is capable of emitting variable visual and audio signals actuated by a control panel component which is designed so that the user can activate various options of visual and audio signals while in flight. The device may further include GPS capability for tracking, activation and deactivation functions.

23 Claims, 4 Drawing Sheets

(56) References Cited

U.S. PATENT DOCUMENTS

| | | |
|---|---|---|
| D511,984 S | 11/2005 | Kumagai |
| D520,395 S | 5/2006 | Lazalier |
| 2003/0132852 A1 | 7/2003 | Povey et al. |
| 2007/0113845 A1* | 5/2007 | O'Brien et al. .......... 128/201.19 |
| 2007/0176784 A1 | 8/2007 | Fautin et al. |
| 2007/0194048 A1 | 8/2007 | Teig |
| 2007/0200716 A1 | 8/2007 | Haase et al. |
| 2008/0088477 A1* | 4/2008 | Martin et al. .............. 340/908.1 |
| 2008/0130272 A1* | 6/2008 | Waters .......................... 362/106 |
| 2008/0247161 A1* | 10/2008 | Hulsey et al. ................. 362/227 |
| 2008/0259601 A1 | 10/2008 | Frank et al. |
| 2008/0319282 A1 | 12/2008 | Tran |

* cited by examiner

MULTI-FUNCTION FLARE DEVICE FOR POPULATED AREAS

CROSS-REFERENCE TO RELATED APPLICATIONS

The present application is a continuation of and claims priority to U.S. application Ser. No. 12/612,632 filed on Nov. 4, 2009, which is a non-provisional of and claims priority to U.S. Provisional Application No. 61/113,117 filed on Nov. 10, 2008, the disclosures of which are incorporated herein by reference.

FIELD OF INVENTION

The present invention relates generally to the field of safety and warning indicators and specifically to multifunctional beaconing devices for safety personnel.

BACKGROUND

Safety personnel such as law enforcement officers, firefighters, medical personnel, military personnel, and security personnel are frequently involved in situations where they must leave their vehicle or where they interact directly with crowds and the public. Vehicles are generally equipped with alarms, safety devices and tracking devices. Once an individual has left their vehicle, they may be vulnerable and unable to access these features. In such situations, it is desirable to have a device that can be carried on his or her person and which provides access to some or all of these safety features.

In particular, it is desirable for safety personnel to be located as quickly as possible when they need assistance or backup. The prior art includes various means for making an individual visible, including audio and visual signaling devices. These devices include safety signaling light emitting diodes, flashlight-type lamp and phosphorescent lights, and reflective and luminescent patches, belts, etc. However, these devices provide limited functionality.

Flare and siren devices are traditionally used to signal distress only in outdoor settings: therefore, their functionality is limited. A flare is a type of pyrotechnic that produces a brilliant light for signaling, illumination, or defense. Flares are used in civilian and military applications. Flares, however, pose hazard, are difficult to use in populated (e.g. urban) settings and are often projectile devices that must be thrown in the air.

Personal sirens, whistles and other audio devices may emit a warning sound, but they do not provide a visual cue as to the location of the person in distress, and may also be difficult to distinguish from other sounds in populated areas.

Technological advances have made it easier to locate persons and vehicles. For example, GPS technology allows a user with the appropriate receiver to receive satellite signals indicating present location and other information.

It is desirable to have a multi-functional device that can be used by security personnel in populated and indoor settings (as well as rural and other outdoor settings), and which offers the functionality of a flare and/or warning siren.

It is further desirable to have a device that is securely affixed to the wearer and is easily accessible in emergencies to offer a visual and/or audio cue for locating a fixed or moving wearer.

It is further desirable to have a device with a wide range of functional signaling capabilities, data capture capabilities and medical information storage capabilities to specifically meet the needs of safety personnel in emergency situations during which they cannot access a vehicle or other equipment.

It is further desirable to have a cost-effective, multi-functional flare device that can be economically offered as standard issue equipment to safety personnel.

Glossary

As defined herein "safety personnel" means persons engaged in activities that have a heightened level of personal risk and potential for emergency and/or confrontational situations including, but not limited to, law enforcement, security, school, medical, traffic, military, supervisory, patrol and cautionary personnel.

As used herein, the term "mercury switch" means a sensor known is the art that senses a change in elevation.

As used herein, the term "securing mechanism" refers to any element or system that stably attaches the personal security alert device for safety personnel disclosed herein to an article of clothing on the user's body. The article of clothing may include, but is not limited to straps, closures, Velcro devices, pockets, specially configured clothing compartments, plastic or fabric holders or any other attachment means known in the art.

As used herein, the term "light component" shall refer to at least a light emitting or luminous component, including, but not limited to light-emitting diodes, fluorescent, xenon, incandescent, halogen, fiber optics, or any other lamp type known in the art, and may be variably colored.

As used herein, the term "beacon component" shall refer to a light source or component designed to draw attention to an object, or which sends out audio or visual signals. A beacon may be designed for overhead and distance visibility. In various embodiments, a beacon may have an audio or visual component. A visual beacon will generally be visible at a maximum distance of zero to 1,000 feet and a height of five to sixty feet, thus assisting in locating an individual in distress.

As used herein, the term "beacon light component" may include light-emitting diodes, fluorescent, xenon, incandescent, halogen, fiber optics, or any other lamp type known in the art, and may be variably colored. In various embodiments, the beacon light component may protrude from a housing or casing to maximize its visibility (e.g., reflecting light in all directions or at 180 degrees).

As used herein, the term "power source" means a lithium or standard battery, electrical power source, solar or other stored energy, hydro-electric power, fossil fuel source or a renewable power source.

As used herein, the term "control panel" shall refer to an interface, including a pressure sensitive interface as defined herein, which activates, deactivates and controls variable visual signals and audio signals emitted from a device, and may be touch sensitive or voice activated.

As used herein, the term "variable visual signal" shall refer to a light signal which may be constant or intermittent and which may include different lights and colors occurring simultaneously or in succession. A variable visual signal may be controlled by a user using a control panel as defined herein.

As used herein, the term "audio signal" shall refer to an audio signal such as an alarm, bell, horn, etc., which may be heard at a distance and serve to identify location.

As used herein, the term "GPS" shall refer to any known Global Navigation Satellite System (GNSS) that can be used to locate a receiver and, when appropriate, to deactivate the device for security purposes.

As used herein, the term "pressure sensitive interface" shall refer to an activation or navigation device that allows a user to control functions and features of an apparatus by applying pressure to the correct option. A pressure sensitive interface may or may not be visible to the user, and may have textured areas, contours or protuberances to guide a user.

As used herein, the term "stably attached" shall refer to a state in which a flare device is affixed to a user's person. A flare device may be attached to the user's clothing, attached to a body part (e.g., arm, leg, neck, head or torso), encased in a pocket or holder, appended to a belt or other article of clothing, secured by a strap or attached within a secure housing.

As used herein, the term "code activated" shall refer to a setting in a control panel that a user may create, such as a code or password, so only authorized users may use the device, ensuring that the device cannot be used if stolen.

As used herein, the term "housing" shall refer to any object contoured to fit stably over a body part such as a shoulder. A housing can be formed from any material including metal, plastic or composites and may include single or multiple parts which fit in or on a pocket, sleeve or other piece of clothing.

As used herein, the term "storage component" refers to a compartment that can hold information (e.g., emergency and medical information) or other data. A storage compartment may include a bar code or electronic memory device.

SUMMARY OF THE INVENTION

The invention disclosed herein is a securely attached portable, wearable device to enhance safety, visibility and communication capability of safety personnel when such personal leave their vehicles. The device provided is configured to be securely attached to the wearer, and is capable of emitting variable visual and audio signals actuated by a control panel component which is designed so that the user can activate various options of visual and audio signals while in flight. The device may further include GPS capability for tracking, activation and deactivation functions.

DETAILED DESCRIPTION OF EMBODIMENTS OF THE INVENTION

Figure 1:
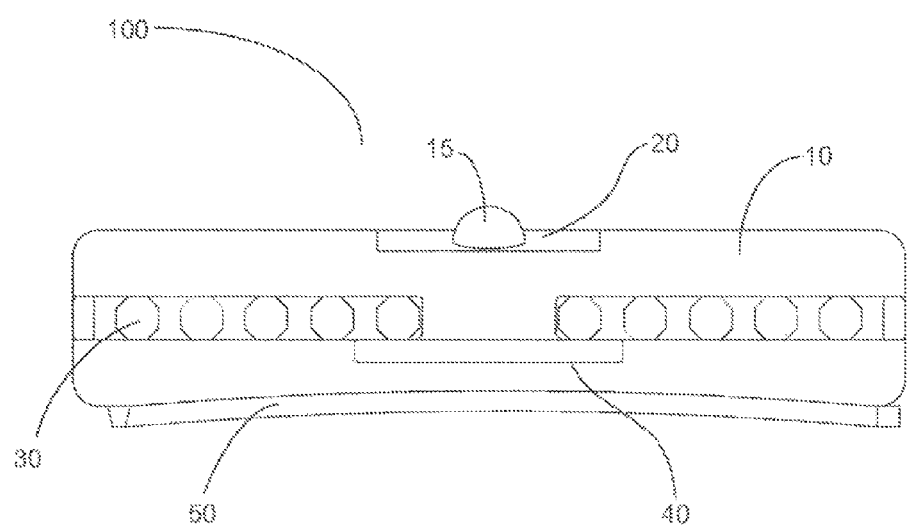
FIG. 1 illustrates a side view of one embodiment of a flare device apparatus.

For the purpose of promoting an understanding of the present invention, references are made in the text hereof to embodiments of a personal security alert device for safety personnel, only some of which are described herein. It should nevertheless be understood that no limitations on the scope of the invention are thereby intended. One of ordinary skill in the art will readily appreciate that modifications, such as the dimensions of a personal security alert device for safety personnel and use of alternate but functionally similar material (s), may be made. The inclusion of additional elements may be deemed readily apparent and obvious to one of ordinary skill in the art, and all equivalent relationships to those described in the written description do not depart from the spirit and scope of the present invention. Some of these possible modifications are mentioned in the following description. Therefore, specific details disclosed herein are not to be interpreted as limiting, but rather as a basis for the claims and as a representative basis for teaching one of ordinary skill in the art to employ the present invention in virtually any appropriately detailed apparatus or manner.

It should be understood that the drawings are not necessarily to scale, emphasis instead being placed upon illustrating the principles of the invention. In addition, in the embodiments depicted herein, like reference numerals in the various drawings refer to identical or near identical structural elements.

Moreover, the term "substantially" or "approximately" as used herein may be applied to modify any quantitative representation that could permissibly vary without resulting in a change in the basic function to which it is related. For example, one embodiment of the flare device disclosed herein may be comprised of a single multi-dimensional and/or textured component, while others may include multiple multi-dimensional and/or textured components.

Referring now to the drawings, FIG. 1 shows a side view of one embodiment of flare device 100. In the embodiment shown, housing 10 is generally rectangular but may be rounded, contoured to fit the curve of a shoulder or any other shape. In the embodiment shown, flare device 100 is worn on the shoulder of a safety personnel user, and attached by hook-and-eye fabric, a clip, spring attachment, magnetic means or any other attachment means known in the art. For example, flare device 100 may be adapted to clip to a lapel or strap.

Visible in housing 10 is beacon aperture 15 for a beacon light component 20. In the embodiment shown, beacon light component 20 protrudes from housing 10 to enable a light to shine in a radius of 180 to 360 degrees.

Also shown in FIG. 1 are optional light components 30. In the embodiment shown, one or more light components 30 are affixed in and around the outside of housing 10. In the embodiment shown, light components 30 may be of various colors to signal different types of security situations, safety issues or types of security personal. For example, red and blue lights may identify a police officer. Red lights may be used to identify a medical alert. Orange lights may be used for mechanical/construction situations and/or personnel. Any colors, combination, or configuration of light components 30 may be used. Lights may also be used to signal an arrest or situation in which a civilian or member of the public has been detained.

In the embodiment shown in FIG. 1, housing 10 is compact, contoured and of sufficient width to encase light component 30, beacon light component 20, as well as power source 70 (not shown) and storage compartment 80 (not shown). In various embodiments, housing 10 can be rectangular oval, square, circular, or other shape which allows light component 30 to provide light in all directions, and may have flat or curved edges. Further, housing 10 may be singly molded or machined, constructed of multiple parts, made from metal, plastic or composites and may be padded and waterproof. Housing 10 must have a large enough aperture to accommodate a multi-directional beacon.

In the embodiment shown in FIG. 1, light component 30 contains a plurality of LED lamps which emit a variable visual signal and are affixed substantially 360 degrees around the outside of housing 10. It will be appreciated that in other embodiments more or less lamps may be used without departing from the scope of the invention, and may include gaps in lamp placement so as to not shine directly in the eyes of the wearer. Further, alternate embodiments of light component 30 may contain lamps of different types including fluorescent, xenon, incandescent, halogen, fiber optics, or any other lamp type known in the art.

In addition to light component 30, FIG. 1 depicts beacon light component 20, which is mounted in or against the top of housing 10. Beacon light component 20 is a high-intensity lamp which emits a variable visual signal. In the embodiment shown in FIG. 1, beacon light component 20 is a single LED lamp centrally placed on the top of housing 10 which protrudes to allow beacon light component 20 to be visible at a 180 degree radius. In other embodiments, the location and positioning of beacon light component 20 may be off-centered to allow optimal light display when activated, and may contain lamps of different types including fluorescent, xenon, incandescent, halogen, fiber optics, or any other lamp type known in the art.

In various embodiments, beacon light component 20 and light components 30 may be colored and/or activated in a coordinated scheme to distinguish a wearer in a particular profession. In certain embodiments, for example, a police officer may use blue, red and white lamps in light component 30 and use a bright white beacon light component 20, while a construction worker may use yellow and white lamps in light component 30 with a yellow beacon light component 20. Thus envisioned, particular light colors emitted from flare device 100 may be incorporated into the uniforms of various professions. In addition, flare device 100 may also emit audio signals at a user's command.

As illustrated in the embodiment in FIG. 1, control panel 40 is shown on the side of housing 10 and adjacent to light component 30. It is contemplated that control panel 40 alternatively be located on the top of housing 10, where it may be more easily activated by a moving user. In the embodiment shown, control panel 40 is a pressure sensitive interface designed for activation while in flight or situations when the wearer cannot look at buttons. In alternate embodiments, control panel 40 may be a roll bar, button or any other engagement mechanism known in the art which allows single or multiple settings, and may contain voice-activation technology and may be code activated. It is contemplated that control panel 40 may contain pattern selector 60 (not shown) to further allow ease of use.

The embodiment in FIG. 1 further includes securing mechanism 50, which is attached to the bottom of housing 10. In various embodiments, securing mechanism 50 may be a safety pin, clip, clamp, clasp, belt, snap, tie, or any other device which can be stably mounted. Securing mechanism 50 may be made from metal, plastic, fabric, composites, Velcro, straps, closures or any combination thereof and may include single or multiple parts. In the embodiment shown, securing mechanism 50 is a safety pin that stably mounts flare device 100 to a wearer's clothing.

Figure 2:
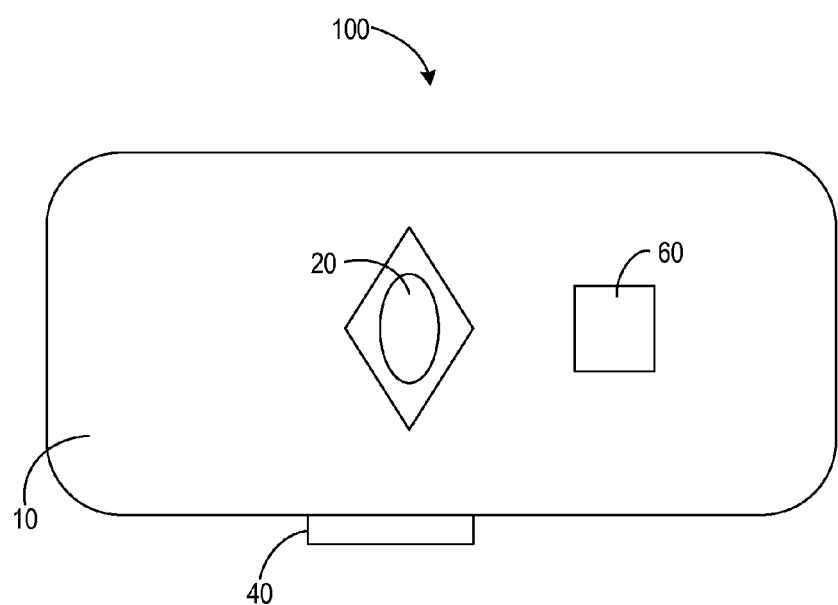
FIG. 2 illustrates a top view of one embodiment of a flare device apparatus.

FIG. 2 illustrates a top view of one embodiment of flare device 100, showing beacon light component 20 in a centrally located position. In the exemplary embodiment, pattern selector 60 is also shown on the top of housing 10. Pattern selector 60 is a pressure sensitive interface or switch that allows a user to navigate between variable visual signals.

Pattern selector 60 may enable a variety of states and settings for flare device 100. In an exemplary embodiment, variable visual signals may include a first setting or position in which all lights in the device are off. A further setting or position may activate selective (e.g., rear or front) light components 30. A further setting or position may activate front rear and side light components 30 and/or cause them to flash at designated intervals. A further setting or position may activate beacon light component 20, while yet other positions may activate all lights, beacons and other emergency features (such as signaling, photography, recording, GPS, paging, sirens, emission of chemicals, weaponry, nausea inducing light frequencies etc.).

In the embodiment shown in FIG. 2, pattern selector 60 is shown on the top of housing 10 and adjacent to beacon light component 20, but may be located anywhere on housing 10. It is contemplated that pattern selector 60 alternatively be located on the side of housing 10. Pattern selector 60 may be a switch, roll bar, button, or any other engagement mechanism known in the art that allows single or multiple settings.

Figure 3:
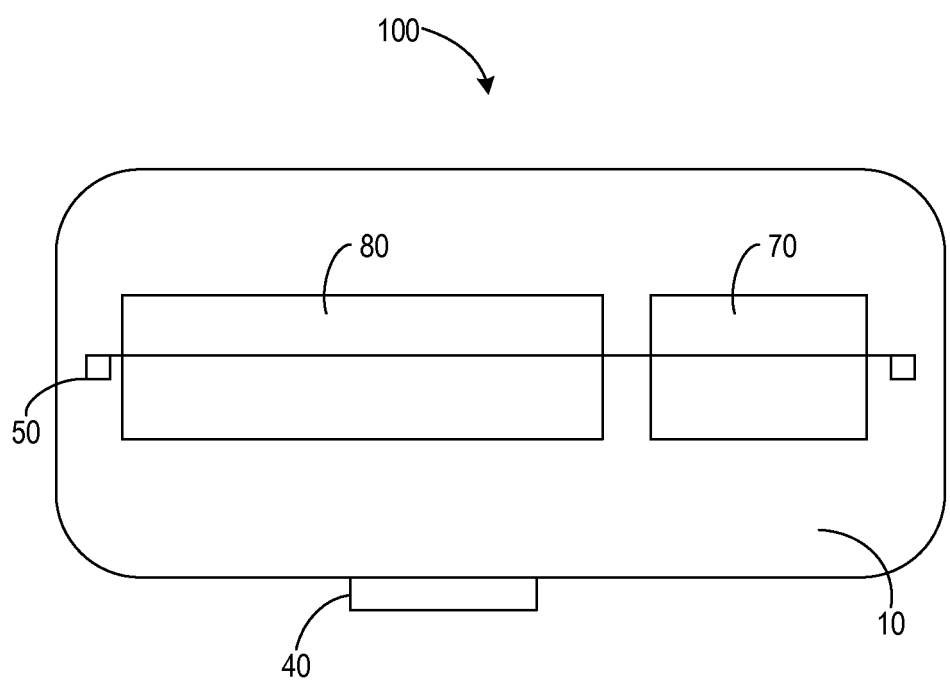
FIG. 3 illustrates a bottom view of one embodiment of a flare device apparatus.
Figure 4:
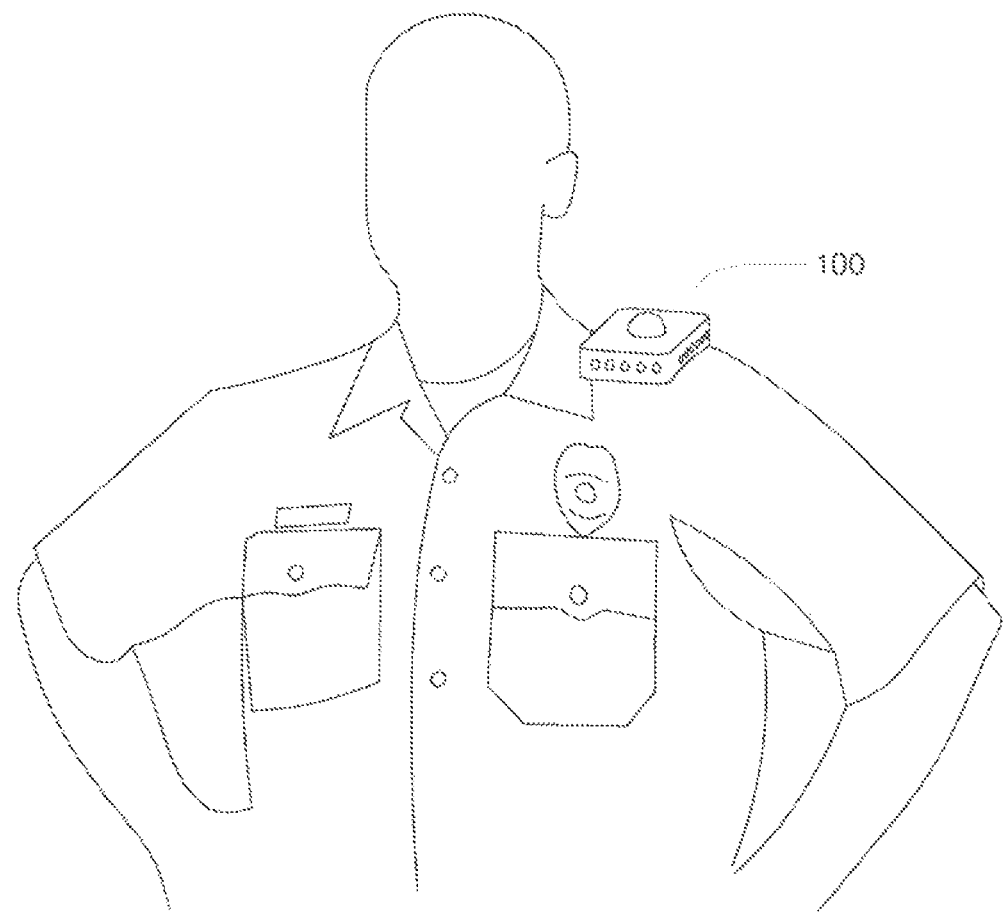
FIG. 4 illustrates one embodiment of a flare device apparatus secured to the shoulder of a safety personal.

FIG. 3 illustrates a bottom view of flare device 100, showing an exemplary securing mechanism 50. In the embodiment shown, securing mechanism 50 is a safety pin which stably mounts flare device 100 to a wearer's clothing. Also shown in the exemplary embodiment are power source 70 and storage component 80. Power source 70 provides power to light component 30 and beacon light component 20.

The exemplary embodiment shown in FIG. 3 also illustrates storage component 80 on the bottom of housing 10, where a user may store vital information such as blood type, known allergies, doctor's name, etc., in case of injury. Storage component 80 contains a lid that is held in place by a releasable retaining piece, which a user may unhook to release contents.

What is claimed is:

1. A personal flare apparatus wearable by safety personnel, the personal flare apparatus comprising:
    a housing having a top surface, a bottom surface, and a plurality of side surfaces;
    a securing component coupled to the bottom surface of the housing, the securing component configured to secure the personal flare apparatus to a shoulder of the safety personnel;
    a first plurality of light components coupled to a front side surface of the plurality of side surfaces of the housing and configured to emit visual signals;
    a second plurality of light components coupled to a rear side surface of the plurality of side surfaces of the housing and configured to emit visual signals in an opposite direction from the visual signals emitted from the first plurality of light components;
    a power source configured to supply power to the first and second plurality of light components; and
    a control panel configured to:
        activate a first signal pattern in response to a first switch setting, the first signal pattern configured to activate the first plurality of lights; and
        activate a second signal pattern in response to a second switch setting, the second signal pattern configured to activate the second plurality of lights.

2. The personal flare apparatus of claim 1 further comprising a high-intensity beacon light coupled to a top surface of the housing and configured to emit visual signals.

3. The personal flare apparatus of claim 1 further comprising a high-intensity audio source configured to emit audio signals.

4. The personal flare apparatus of claim 1 further comprising a video recording device.

5. The personal flare apparatus of claim 4 wherein the control panel is configured to activate the video recording device in response to a third switch setting.

6. The personal flare apparatus of claim 1 wherein the securing component comprises a magnetic attachment component.

7. The personal flare apparatus of claim 1 further comprising a GPS component; and wherein the control panel is configured to activate the GPS component in response to a third switch setting.

8. The personal flare apparatus of claim 1 wherein the control panel is further configured to:
deactivate the first plurality of lights in response to the second switch setting; and
deactivate the second plurality of lights in response to a third switch setting.

9. The personal flare apparatus of claim 1 further comprising an audio component; and
wherein the control panel is configured to activate the audio component in response to a third switch setting.

10. The personal flare apparatus of claim 1 further comprising a third plurality of light components coupled to at least one additional side surface of the plurality of side surfaces of the housing distinct from the front side surface and the rear side surface.

11. The personal flare apparatus of claim 1 wherein the high-intensity beacon light is configured to emit visual signals in a radius of 180 degrees to 360 degrees.

12. The personal flare apparatus of claim 1 further comprising a storage component coupled to the housing and constructed to store vital information related to the safety personal.

13. A method of making a personal flare apparatus comprising:
coupling a securing component to a housing, the securing component configured to secure the housing to a user;
coupling a beacon component to a top surface of the housing, the beacon component configured to emit a signal;
coupling a first plurality of light components to front-facing surface of the housing, the first plurality of light components configured to emit visual signals from the front-facing surface of the housing;
coupling a second plurality of light components to rear-facing surface of the housing, opposite the front-facing surface, the second plurality of light components configured to emit visual signals from the rear-facing surface of the housing;
providing a power source configured to supply power to the beacon component and to the first and second pluralities of light components; and
configuring a pattern selector to:
activate the beacon component in response to a first user switch activation;
activate the first plurality of light components in response to a second user switch activation; and
activate the second plurality of light components in response to a third user switch activation.

14. The method of claim 13 further comprising configuring the pattern selector to simultaneously activate the beacon component and at least one of the first plurality of light components and the second plurality of light components.

15. The method of claim 13 wherein coupling a beacon component comprises coupling one of a high-intensity beacon light configured to emit visual signals and a high-intensity audio source configured to emit audio signals to the top surface of the housing.

16. The method of claim 13 further comprising configuring the pattern selector to:
deactivate the beacon component in response to a fourth user switch activation if the beacon component is activated;
deactivate the first plurality of light components in response to the fourth user switch activation if the first plurality of light components is activated; and
deactivate the second plurality of light components in response to the fourth user switch activation if the second plurality of light components is activated.

17. A personal flare device comprising:
a housing;
a securing component configured to secure the personal flare device to a safety personnel;
a video-recording device;
a beacon coupled to the housing and configured to emit a signal from a first surface of the housing;
a plurality of lights coupled to the housing and configured to emit visual signals from a plurality of side surfaces of the housing; and
a control panel configured to be activated by one hand of the safety personnel and configured to:
activate a first signal pattern in response to a first user switch activation, the first signal pattern configured to cause the signal to emit from the beacon component; and
activate a second signal pattern in response to a second user switch activation, the second signal pattern distinct from the first signal pattern and configured to cause the visual signals to emit from the plurality of light components.

18. The flare device of claim 17 further comprising a battery configured to supply power to the beacon and to the plurality of lights.

19. The flare device of claim 17 wherein the beacon comprises one of a high-intensity beacon light and a high-intensity audio source.

20. The flare device of claim 17 wherein the securing component comprises a magnetic means for securing the personal flare device to the safety personal.

21. The flare device of claim 17 wherein the plurality of lights comprises a first set of lights of a first color and a second set of lights of a second color; and
wherein the first color is distinct from the second color.

22. The flare device of claim 17 wherein the control panel is further configured to:
activate one of front light components and rear light components in response to the second user switch activation; and
activate the other of front light components and rear light components in response to a fourth user switch activation; and
wherein the front light components comprise a subset of the plurality of lights coupled to a front surface of the housing; and
wherein the rear light components comprise a subset of the plurality of lights coupled to a rear surface of the housing.

23. The flare device of claim 17 wherein the control panel is further configured to:
selectively activate and deactivate the video-recording device: and
deactivate an active signal pattern in response to a third user switch activation.

* * * * *